(12) United States Patent
Iyechika et al.

(10) Patent No.: US 6,388,323 B1
(45) Date of Patent: *May 14, 2002

(54) ELECTRODE MATERIAL AND ELECTRODE FOR III-V GROUP COMPOUND SEMICONDUCTOR

(75) Inventors: Yasushi Iyechika; Noboru Fukuhara; Tomoyuki Takada, all of Tsukuba; Yoshinobu Ono, Ibaraki-ken, all of (JP)

(73) Assignee: Sumitomo Chemical Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 08/808,537

(22) Filed: Feb. 28, 1997

Related U.S. Application Data

(63) Continuation of application No. 08/392,244, filed on Feb. 22, 1995, now Pat. No. 5,708,301.

(30) Foreign Application Priority Data

Feb. 28, 1994 (JP) .............................. 6-030066

(51) Int. Cl.$^7$ ............................... H01L 23/48
(52) U.S. Cl. ........................ 257/744; 257/745
(58) Field of Search ................ 257/741, 744, 257/745

(56) References Cited

U.S. PATENT DOCUMENTS

| 5,047,832 A | 9/1991 | Tonai ........................ 257/766 |
| 5,414,281 A | 5/1995 | Watabe et al. ................ 257/95 |
| 5,708,301 A * | 1/1998 | Iyechika et al. ............ 257/744 |

FOREIGN PATENT DOCUMENTS

| JP | 49-29770 A | 3/1974 |
| JP | 56-50588 | 5/1981 |
| JP | 62-22556 | 5/1987 |
| JP | 62-155562 A | 7/1987 |
| JP | 5-211347 | 8/1993 |
| JP | 5-291621 | 11/1993 |
| JP | 6-61527 A | 3/1994 |

OTHER PUBLICATIONS

Amano et al., *Jap. J. of Appl. Phys.*, vol. 28, No. 12, Dec. 1989, "P–Type Conduction in Mg–Doped . . . ," pp. L2112–L2114.

Goldenberg et al., *Appl. Phys. Lett.* 62 (4), Jan. 25, 1993, "Ultraviolet and Violet Ligh–Emitting GaN . . . ," pp. 381–383.

Hacke et al., *Appl. Phys. Lett.*, 63 (19), Nov. 8, 1993, "Schottky Barrier on . . . ," pp. 2676–2678.

Nakamura et al., *Jap. J. Appl. Phys.*, vol. 30, No. 12A, Dec. 1991, "High Power GaN P–N . . . ," pp. L1998–L2001.

Foresi et al., *Appl. Phys. Lett.*, 62 (22), May 31, 1993, "Metal Contacts to . . . ", pp. 2859–2861.

Khan et al., *Appl. Phys. Lett.*, 58 (21), May 27, 1991, "High Electron Mobility Gan/Al$_x$Ga$_{1-x}$N . . . ," pp. 2408–2410.

\* cited by examiner

*Primary Examiner*—Mark V. Prenty
(74) *Attorney, Agent, or Firm*—Birch, Stewart, Kolasch & Birch, LLP

(57) ABSTRACT

The invention provides an electrode material having the low contact resistance against a III-V group compound semiconductor, thereby realizing a light emitting device having a high luminance and driven at low voltages. The electrode material of the invention is applied to a III-V group compound semiconductor, which is expressed as a general formula of $In_xGa_yAl_zN$, where $x+y+z=1$, $0 \leq x \leq 1$, $0 \leq y \leq 1$, and $0 \leq z \leq 1$, and doped with p-type impurities. The electrode material comprises an alloy of Au and at least one metal selected from the group consisting of Mg and Zn.

2 Claims, 8 Drawing Sheets

ELECTRODE MATERIAL AND ELECTRODE FOR III-V GROUP COMPOUND SEMICONDUCTOR

This application is a continuation of application Ser. No. 08/392,244, filed on Feb. 22, 1995, now U.S. Pat. No. 5,708,301, the entire contents of which are hereby incorporated by reference.

BACKGROUND OF THE INVENTION

1. Field of the Invention

The present invention relates to an electrode material and an electrode for a III-V group compound semiconductor.

2. Description of the Related Art

III-V group compound semiconductors expressed as a general formula of $In_xGa_yAl_zN$, where $x+y+z=1$, $0 \leq x \leq 1$, $0 \leq y \leq 1$, and $0 \leq z \leq 1$ are applied to light emitting device ultra-violet or blue light emitting diodes and ultra-violet or blue laser diodes. Properties of these compound semiconductors have, however, hardly been elucidated, and no electrode materials having low contact resistance against the p-type III-V group compound semiconductors have been obtained yet.

Development of electrode materials having low contact resistance against the p-type III-V group compound semiconductors is highly demanded in order to realize light emitting devices of favorable electric properties.

DETAILED DESCRIPTION OF THE INVENTION

One object of the invention is thus to provide an electrode material having the low contact resistance against a III-V group compound semiconductor, which is expressed as a general formula of $In_xGa_yAl_zN$, where $x+y+z=1$, $0 \leq x \leq 1$, $0 \leq y \leq 1$ and $0 \leq z \leq 1$, and doped with p-type impurities.

Another object of the invention is to realize a light emitting device having a high luminance and driven at low voltages.

As a result of extensive studies, the inventors have found that an alloy of Au and a specific metal has a sufficiently low contact resistance against the III-V group compound semiconductors.

The invention is directed to an electrode material applied to a III-V group compound semiconductor, which is expressed as a general formula of $In_xGa_yAl_zN$, where $x+y+z=1$, $0 \leq x \leq 1$, $0 \leq y \leq 1$ and $0 \leq z \leq 1$, and doped with p-type impurities, the electrode material comprising an alloy of Au and at least one metal selected from a group consisting of Mg and Zn.

Also the invention is directed to an electrode applied to a III-V group compound semiconductor, which is expressed as a general formula of $In_xGa_yAl_zN$, where $x+y+z=1$, $0 \leq x \leq 1$, $0 \leq y \leq 1$ and $0 \leq z \leq 1$, and doped with p-type impurities, the electrode formed with the afformentioned material.

The electrode material of the invention is applicable to III-V group compound semiconductors which are expressed as a general formula of $In_xGa_yAl_zN$, where $x+y+z=1$, $0 \leq x \leq 1$, $0 \leq y \leq 1$ and $0 \leq z \leq 1$, and doped with p-type impurities.

Such III-V group compound semiconductors are prepared, for example, by molecular beam epitaxy (hereinafter referred to as MBE), by organometallic vapor phase epitaxy (hereinafter referred to as MOVPE), or hydride vapor phase epitaxy (hereinafter referred to as HVPE). Gas source molecular beam epitaxy (hereinafter referred to as GSMBE) is generally applied among the MBE processes, where nitrogen gas, ammonia gas, or another gaseous nitrogen compound is supplied as nitrogen source. The nitrogen source may be chemically inactive, which prevents nitrogen atoms from being easily taken into the crystal. Under such conditions, the nitrogen source may be excited and activated by a method, for example microwave excitation, thereby enhancing the intake efficiency of nitrogen atoms.

In the case of MOVPE, using so called 2 step-growth method, where a buffer layer such as thin film of AlN or GaN is grown on the substrate and the compound semiconductor is grown on the buffer layer, is effective to obtain the compound semiconductor of good crystallinity (Applied Physics Letters, vol. 48 (1986), p 353, Japanese Journal of Applied Physics, vol. 30 (1991), p L1705).

Examples of the p-type impurities applicable to the invention include Mg, Zn, Cd, Be, Ca, and Hg. Preferable impurity atoms are Mg and Zn, and more specifically Mg.

The p-type impurities are given from the materials described below.

As long as a simple body of dopant is controlled to a vapor pressure which does not interfere with other molecular beams in a device of manufacturing the III-V group compound semiconductor by the process of GSMBE, the simple body of dopant is directly applied as the p-type impurity.

Volatile materials given below may be applied in the process of MOVPE.

Examples of material for giving zinc atoms (Zn) include alkylzincs expressed as a general formula of $R_1R_2Zn$, where $R_1$ and $R_2$ are, independently from each other, alkyl groups having 1 to 4 carbon atoms, such as dimethylzinc $(CH_3)_2Zn$ and diethylzinc $(C_2H_5)_2Zn$.

Examples of material for giving magnesium atoms (Mg) include bis(cyclopentadienyl)magnesium $(C_5H_5)_2Mg$ (hereinafter referred to as $Cp_2Mg$), bis(methylcyclopentadienyl)magnesium $(CH_3C_5H_4)_2Mg$, and bis(isopropylcyclopentadienyl)magnesium $(i-C_3H_7C_5H_4)_2Mg$.

Examples of material for giving cadmium atoms (Cd) include alkylcadmiums expressed as a general formula of $R_1R_2Cd$, where $R_1$ and $R_2$ are, independently from each other, alkyl groups having 1 to 4 carbon atoms, such as dimethylcadmium $(CH_3)_2Cd$.

Examples of material for giving beryllium atoms (Be) include diethylberyllium $(C_2H_5)_2Be$ and bis(methylcyclopentadienyl)beryllium $(CH_3C_5H_4)_2Be$.

Examples of material for giving mercury atoms (Hg) include alkylmercuries expressed as a general formula of $R_1R_2Hg$, where $R_1$ and $R_2$ are, independently from each other, alkyl groups having 1 to 4 carbon atoms, such as dimethylmercury $(CH_3)_2Hg$ and diethylmercury $(C_2H_5)_2Hg$.

The electrode material of the invention applied to III-V group compound semiconductors is an alloy of Au and at least one metal selected from the group consisting of Mg and Zn. Concrete examples are Au—Mg, Au—Zn and Au—Zn—Mg alloys.

Preferable concentration range of Mg in the electrode material is 0.1 to 2.5% by weight. Preferable concentration range of Zn in the electrode material is 1 to 30% by weight.

The electrode material of the invention has the low contact resistance against the III-V group compound semiconductor, thereby realizing a light emitting device having a high luminance and driven at low voltages.

The electrode material applicable for the III-V group compound semiconductor is prepared in the following manner.

At a first step, a III-V group compound semiconductor, which is expressed as a general formula of $In_xGa_yAl_zN$, where x+y+z=1, $0 \leq x \leq 1$, $0 \leq y \leq 1$ and $0 \leq z \leq 1$, and doped with p-type impurities is grown according to a known method. The electrode material of the invention is then vacuum-deposited onto the compound semiconductor. It is preferable to vacuum-deposit the electrode material of the invention after the III-V group compound semiconductor is irradiated with electron beams or heated to 500° C. or higher temperatures for annealing.

Any known method is applicable to vacuum deposition. For example, an Au—Zn alloy is vacuum-deposited on the compound semiconductor with a tungsten boat by the resistance heating process.

In another application, a semiconductor laminate formed by vacuum deposited Au and a specific metal on the compound semiconductor is annealed to form an alloy on the semiconductor.

In some cases, annealing improves the electric contact.

An atmosphere applied for annealing may be sufficiently purified nitrogen gas or inert gas such as argon. The temperature of annealing is preferably in a range of 200° C. to 1,000° C. or more specifically in a range of 300° C. to 900° C. The lower annealing temperature results in insufficient effects whereas the higher annealing temperature causes denaturation of constituents of the semiconductor device so as to deteriorate the properties of the semiconductor device.

The time period for annealing is determined according to the annealing temperature, but is preferably in a range of 1 second to 2 hours or more specifically in a range of 2 seconds to 30 minutes. The shorter annealing time results in insufficient effects whereas the longer annealing time causes denaturation of constituents of the semiconductor device so as to deteriorate the properties of the semiconductor device or worsen the productivity.

Another metal may further be laid over the electrode which is in contact with the III-V group compound semiconductor. This enhances the mechanical strength and other mechanical properties without damaging the electric properties.

A concrete example of an electrode, which has the above mentioned laminate structure, is schematically shown in FIG. 1, where the second metal electrode 3 is deposited onto both surfaces of the electrode of the invention 2 and of the compound semiconductor 1. The examples of the metals which may be used as the second electrode are, Al, Ti and Cr. Among these metals, Al may be preferably used because of its good adhesion properties to the compound semiconductor.

In general, an electric contact is made to the second electrode.

EXAMPLES

Figure 1:
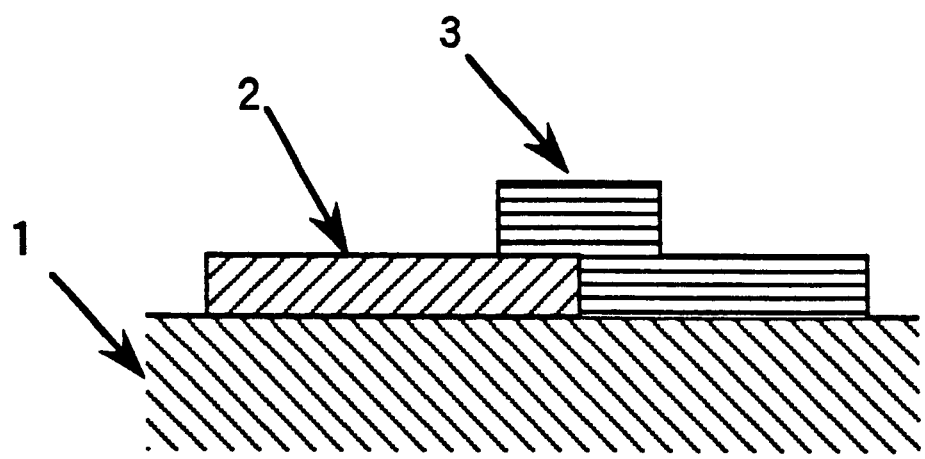
FIG. 1 shows structure of a laminate of electrodes of III-V group compound semiconductor where the invention is used as the first electrode.

Preferred examples according to the invention are described in detail although the invention is not limited to these examples in any sense. The evaluation of the electrodes was made by comparing the characteristics with those of Au electrode, which is made on each p-type GaN sample used in an example.

Example 1 & Reference 1

A gallium nitride semiconductor was prepared by the process of atmospheric pressure MOVPE. The gases used here were $NH_3$, carrier gas $H_2$, trimethylgallium $Ga(CH_3)_3$ (hereinafter referred to as TMG). $Cp_2Mg$ was used as a p-type Mg dopant.

A III-V group compound semiconductor having structure shown in FIG. 2 was prepared in the following manner.

A substrate 4 of sapphire single crystal having a C face cleaned with organic solvent was set on a graphite susceptor installed in a MOVPE reactor. Then the substrate was heated to 1,100° C. in a hydrogen flow. Then the reactor, the susceptor, and the substrate were etched by further supply of hydrogen chloride gas at this temperature. The flow rate of hydrogen and hydrogen chloride during the etching was 2 slm and 10 sccm for hydrogen and hydrogen chloride respectively. Here, slm and sccm are units of gas flow, where 1 slm is a flow of gas, which occupies 1 liter at the normal state, in a minute, and seem is defined as 1000 sccm=1 slm. After stopping the supply of hydrogen chloride gas, the substrate was further kept at this temperature for 5 minutes. Then a buffer layer 5 of 500 Å thick GaN was grown on the substrate at 600° C., and then 3 μm thick Mg doped GaN 6 was grown on the buffer layer at 1100° C. The amounts of materials supplied during the buffer layer growth were 2 slm, 2 slm, and $6.7 \times 10^{-6}$ mol/min for $H_2$, $NH_3$, and TMG, respectively, and during the growth of Mg doped GaN, 4 slm, 4 slm and $4.5 \times 10^{-5}$ mol/min for $H_2$, $NH_3$, and TMG, respectively. During the growth of Mg doped GaN layer, $H_2$ of 100 sccm was introduced to the reactor through the $Cp_2Mg$ container kept at 30° C. After the growth, the substrate was detached from the reactor, and was annealed at 800° C. in the atmosphere of nitrogen for 20 minutes. A p-type gallium nitride semiconductor having concentration of carrier of about $2 \times 10^{18}/cm^3$ was prepared accordingly.

Figure 3:
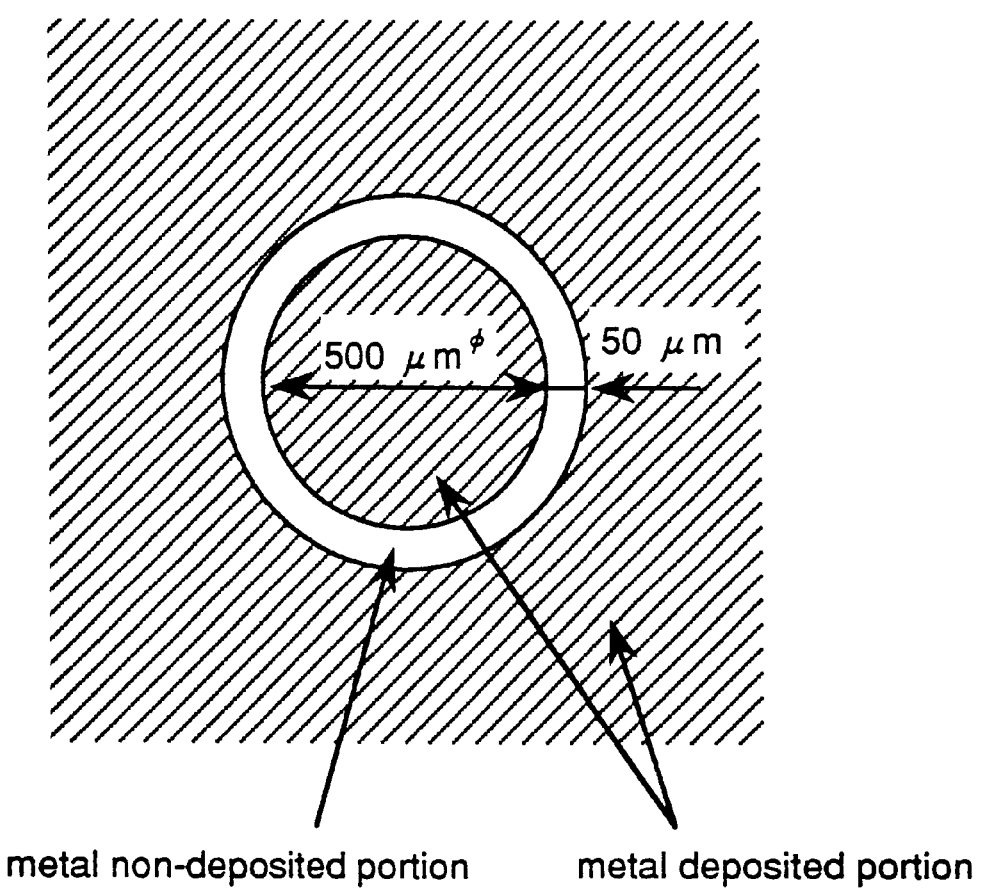
FIG. 3 shows distinction between a vapor deposited portion and a non-vapor deposited portion on an electrode.

Mg and Au were vacuum deposited in this order onto the p-type GaN thus prepared with the pattern shown in FIG. 3. Two samples with different thickness of deposited metals were prepared, where Mg contents to the total amount of the deposited metals were 0.3 and 1% by weight in each electrode, with the total thickness of Mg and Au being 1500 Å for each sample. As a reference sample, Au electrode of 1500 Å thickness was also deposited onto the p-type GaN used for the example.

When the inner circular electrode in FIG. 3 is positively biased, the circuit is forward-biased.

Figure 4:
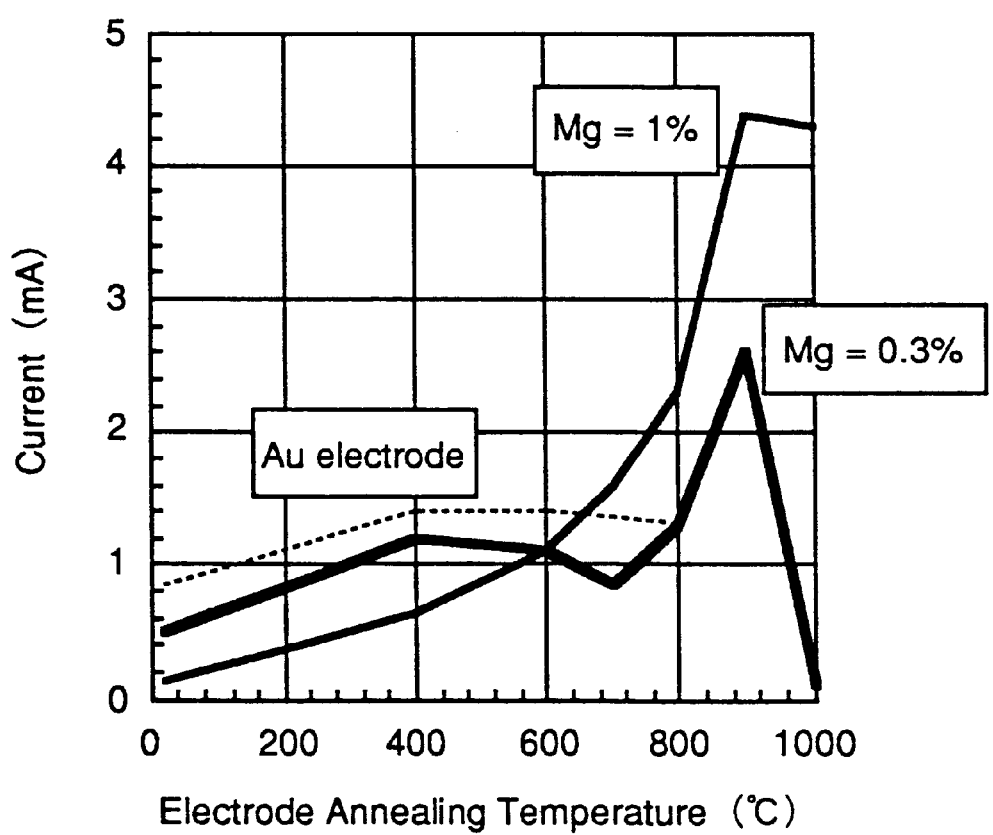
FIG. 4 is a graph showing relationship between annealing temperature of electrodes and the forward current in Example 1.

The relationship between the current at a forward bias of 4 V and the annealing temperature of the electrodes are shown in FIG. 4 together with the results of the Au electrode. The samples were annealed in a nitrogen atmosphere for 90 seconds. The graph shows that the electrode of 0.3% Mg concentration by weight annealed at 900° C., and that of 1% Mg concentration by weight annealed at 800° C. or higher temperatures have better electric contact than the Au electrode.

Figure 5B:
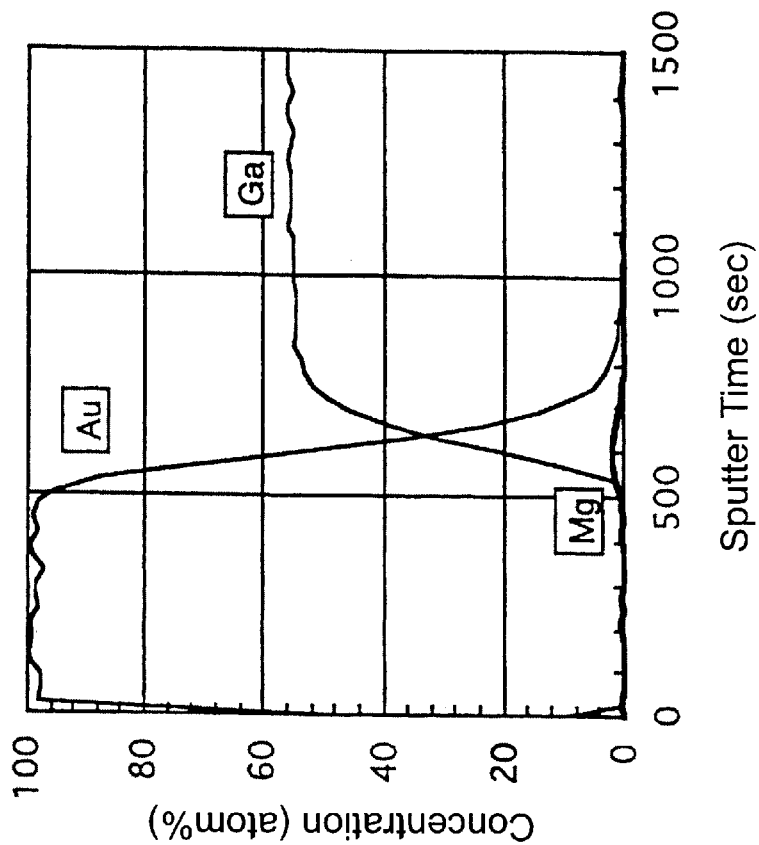
FIG. 5 is a graph showing the depth profile of Au, Mg and Ga in the electrode of the invention, (a) is for the electrode before the anneal, and (b) for after the anneal.
Figure 5A:
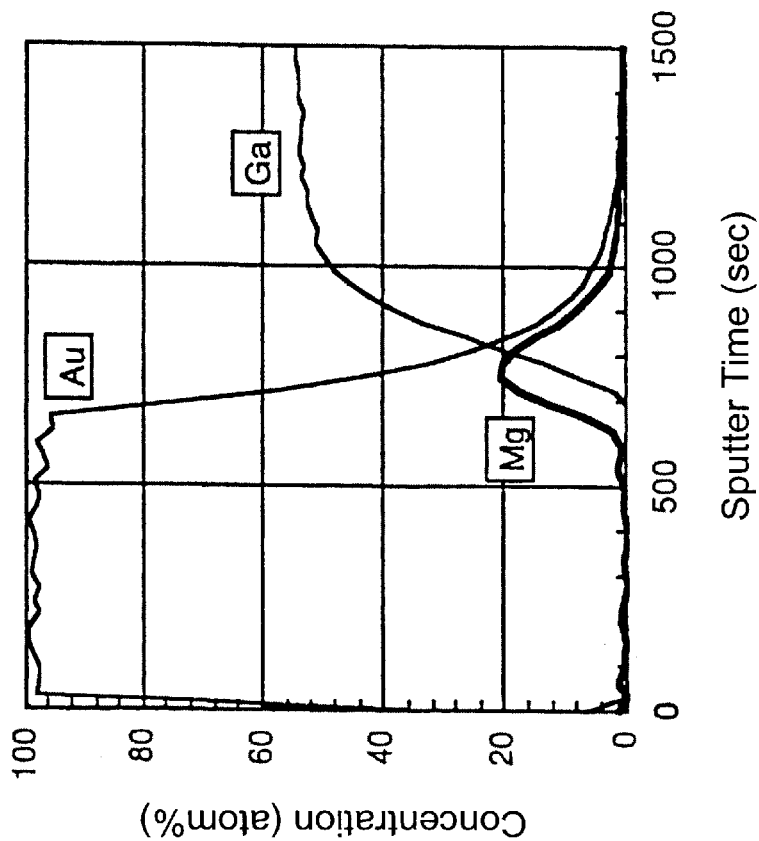

FIG. 5 shows the depth profile of Au, Mg, and Ga in the electrode of the invention prepared by the method described in this example, where the total thickness of Mg and Au was 1500 Å and the weight of Mg in the electrode was 1% of the total weight of Au and Mg. The profile was measured by X-ray photoelectron spectroscopy. FIGS. 5(a) and (b) correspond to samples before and after anneal of the electrode, respectively, where the electrode was annealed in a nitrogen atmosphere at 800° C. for 90 seconds. The abscissa of the figure is sputtering time of the electrode by Ar ion, which corresponds to the depth from the surface of the electrode. From this figure, it is clear that there are Mg layer and Au layer on GaN in this order before the anneal, and that Mg layer is almost disappeared after the anneal, showing that Mg diffused into the Au layer by making alloy with Au.

Example 2 & Reference 2

Figure 2:
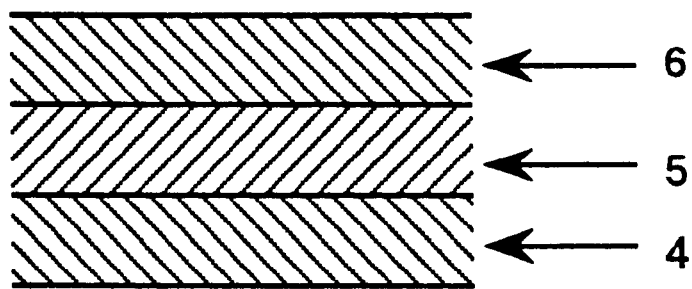
FIG. 2 shows structure of a III-V group compound semiconductor prepared in Example 1.
Figure 6:
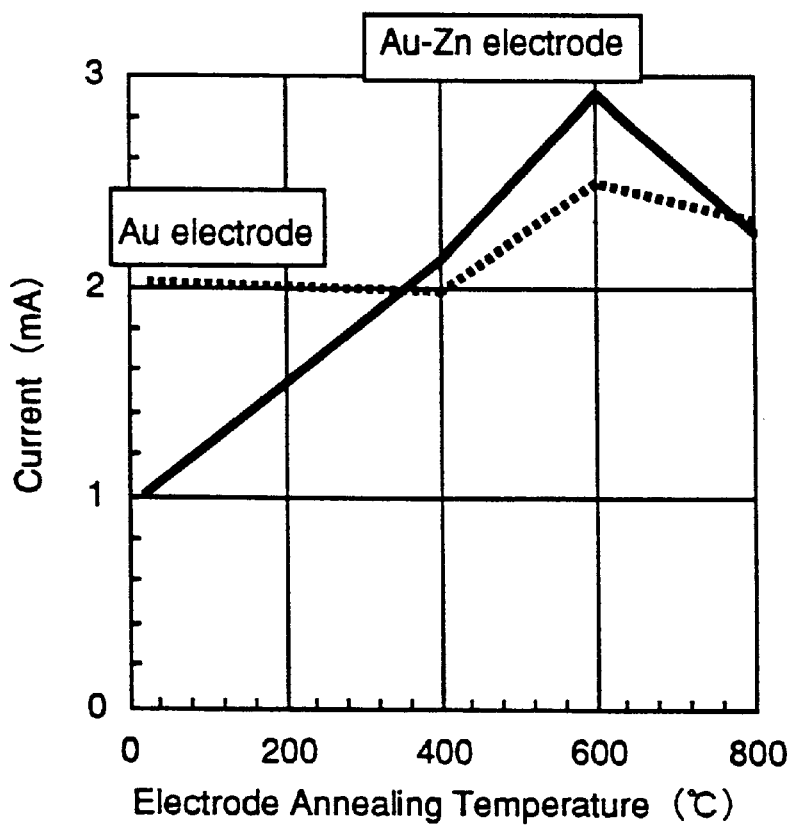
FIG. 6 is a graph showing relationship between annealing temperature of electrodes and the forward current in Example 2.

AuZn (containing 5% by weight of Zn) electrode having a pattern shown in FIG. 2 as well as an Au electrode (Reference 2) were vacuum deposited in the depth of 1500-Å onto the p-type gallium nitride semiconductor prepared in the same manner as Example 1. The same relationship as FIG. 4 for these samples are shown in FIG. 6. This graph shows that the electrode of Example 2 has the lower contact resistance against the p-type GaN than the Au electrode when annealed at 400° C. or higher temperatures.

Example 3 & Reference 3

Figure 7:
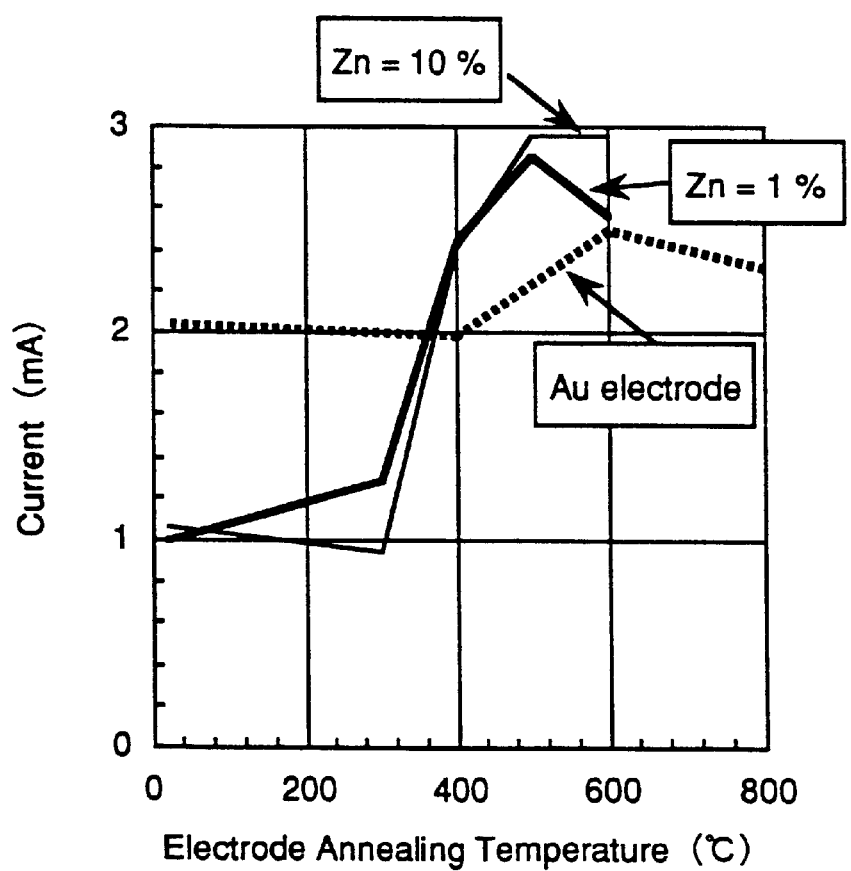
FIG. 7 is a graph showing relationship between annealing temperature of electrodes and the forward current in Example 3.

AuZn electrodes of Zn concentration of 1 and 10% by weight with total thickness of 1,500 Å were prepared in the same manner as Example 1 except that Zn was used instead of Mg. An Au electrode of 1,500 Å was prepared onto the same p-type GaN as a reference (Reference 3). The same rerationship with FIG. 4 for these electrodes are shown in FIG. 7. The graph shows that the electrodes of Zn concentrations between 1 and 10% by weight have better electric contact compared to Au electrode when annealed at 400° C. or higher temperatures.

Example 4 & Reference 4

Figure 8:
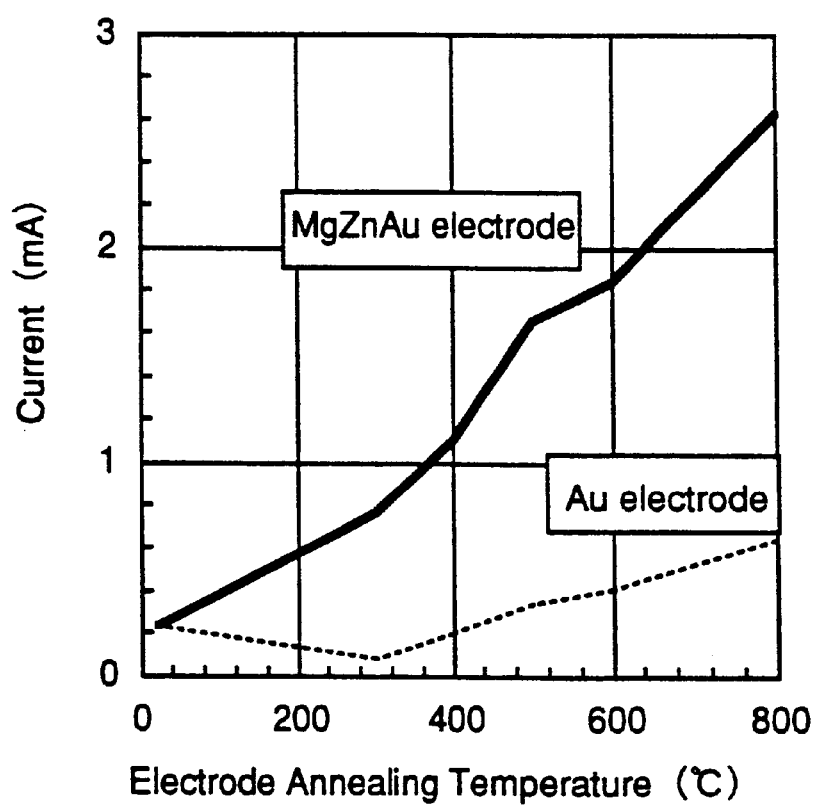
FIG. 8 is a graph showing relationship between annealing temperature of the electrodes and the forward current in Example 4.

Mg, Zn and Au were deposited in this order onto the p-type GaN prepared in the same manner as Example 1. The total thickness was 1,500 Å, and Mg and Zn concentrations were both 1% by weight. An Au electrode of 1,500 Å was prepared onto the same p-type GaN as a reference (Reference 4). The same relationship with FIG. 4 for these electrodes are shown in FIG. 8. The graph shows that the electrode of Example 4 has better electric contact compared to Au electrode when annealed at 300° C. or higher temperatures.

What is claimed is:

1. An electrode material applied to a III-V group compound semiconductor expressed as a general formula of $In_xGa_yAl_zN$, where $x+y+z=1$, $0 \leq x \leq 1$, $0 \leq y \leq 1$, and $0 \leq z \leq 1$, said compound semiconductor being doped with p-type impurities, said electrode material comprising an alloy of Au and at least one metal selected from the group consisting of Mg and Zn, wherein Mg is present in a concentration range of from 0.1 to 2.5% by weight based on the electrode material and Zn is present in a concentration range of from 1 to 30% by weight based on the electrode material.

2. An electrode applied to a III-V group compound semiconductor expressed as a general formula of $In_xGa_yAl_zN$, where $x+y+z=1$, $0 \leq x \leq 1$, $0 \leq y \leq 1$, and $0 \leq z \leq 1$, said compound semiconductor being doped with p-type impurities, and said electrode being made of the electrode material claimed in claim 1.

* * * * *